United States Patent

Koterasawa

[11] Patent Number: 4,587,491
[45] Date of Patent: May 6, 1986

[54] IC CLASS AB AMPLIFIER OUTPUT STAGE

[75] Inventor: Matsuro Koterasawa, Hachioji, Japan

[73] Assignee: National Semiconductor Corporation, Santa Clara, Calif.

[21] Appl. No.: 728,554

[22] Filed: Apr. 29, 1985

[51] Int. Cl.$^4$ ............................................. H03F 3/26
[52] U.S. Cl. .................................... 330/268; 330/274
[58] Field of Search ............... 330/255, 262, 268, 270, 330/271, 273, 274

[56] References Cited

U.S. PATENT DOCUMENTS 3,974,456  8/1976  Russell et al. ........................ 330/300
4,316,149  2/1982  Yamaguchi ...................... 330/274 X Primary Examiner—Eugene R. LaRoche
Assistant Examiner—Steven J. Mottola
Attorney, Agent, or Firm—Gail W. Woodward; Paul J. Winters; Michael J. Pollock

[57] ABSTRACT

A class AB monolithic silicon IC output stage is shown wherein the main output transistors are NPN structures. The current sourcing transistor is provided with an additional scaled down reference emitter and the two emitters connected to the inputs of an op amp which has its output coupled to drive the current sink transistor. The base of the current source transistor is driven from a high gain driver transistor stage which may also contain a d-c level shifter that permits the inclusion of a complementary current sink transistor that can greatly reduce cross-over distortion while conducting only quiescent current.

9 Claims, 3 Drawing Figures

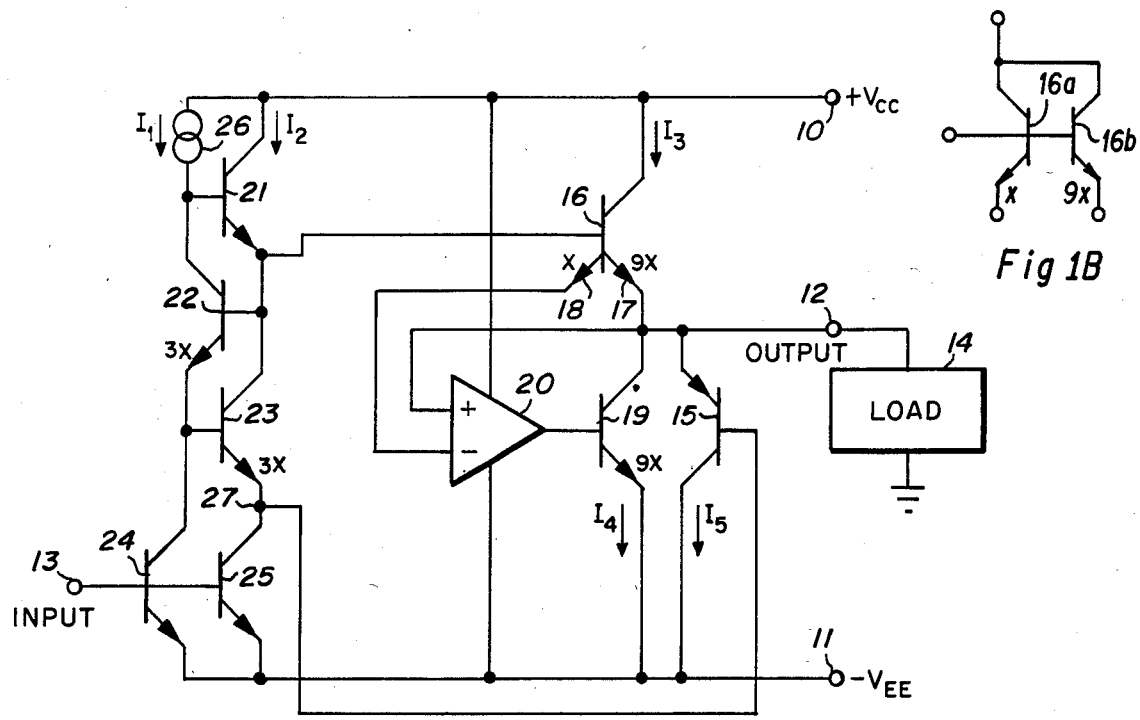
Fig 1B
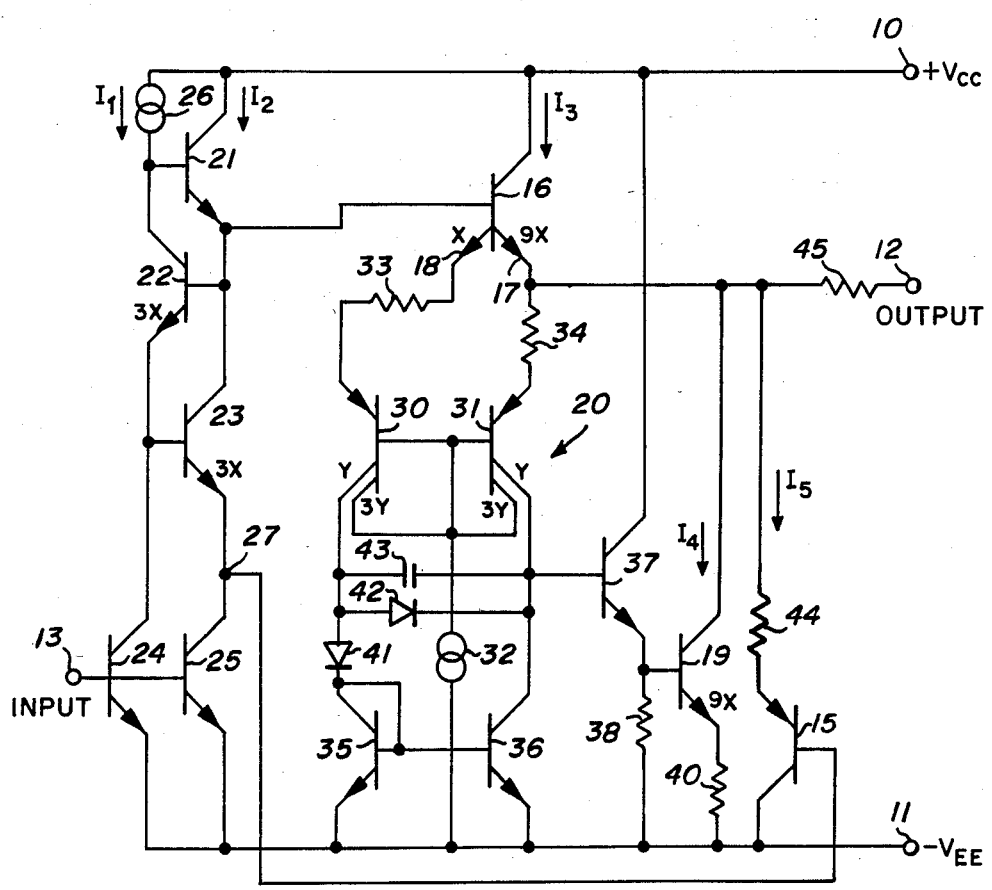
Fig_1A
Fig_2

IC CLASS AB AMPLIFIER OUTPUT STAGE

BACKGROUND OF THE INVENTION

The invention relates to the output stage employed in a monolithic silicon integrated circuit (IC) amplifier. One well-known form of output stage is disclosed and claimed in U.S. Pat. No. 3,974,456, which was issued to Ronald W. Russell and Kyle M. Black on Aug. 10, 1976. This patent, which is assigned to the assignee of the present application, teaches a pair of NPN output transistors biased by means of P-channel junction field effect transistor (JFET) devices. This circuit is exemplified in the LF156 which is available commercially from National Semiconductor Corporation and others.

Another commonly used IC amplifier output stage design which employs a complementary transistor is exemplified in the LM163, which is also commercially available from National Semiconductor Corporation and others. Here, an NPN transistor acts as an output terminal current source and hence provides the pull-up function. A PNP transistor acts as a current sink to provide the pull-down function. This configuration provides excellent performance but suffers an asymmetry in its current sinking capability. The PNP transistor is not able to sink as much current as an equivalent size NPN transistor can source. It also suffers to a small degree, at the higher frequencies, from an asymmetry in the gain versus frequency roll off. In general, IC PNP transistors have a much lower gain bandwidth than the NPN transistors. When the complementary device circuit is employed at the higher frequencies, the output will display a phase shift between the positive and negative signal swings. Finally, in junction isolated IC structures the PNP devices are commonly of vertical construction, particularly in those cases where the collector is dedicated to the IC substrate which is the most negative circuit potential. In such a case all of the current that flows in the PNP transistor is in the form of carriers that must flow in the IC substrate. Such carriers must flow across the substrate to a nearby contact thereby developing undesired potential drops.

To overcome some of the problems of the complementary device circuit a quasi-complementary circuit has been used. Here a pair of NPN output transistors are employed, but one of them, the current sink device, is driven by a PNP transistor to create a composite pair that acts as if it were a single PNP transistor. In this circuit the actual PNP transistor is usually of lateral construction and only has to handle low level signals. Thus, substrate currents are avoided, but the circuit is still slow so that a high frequency phase shift asymmetry is encountered. One version of such a circuit is found in the patent application of Harry J. Bittner Ser. No. 493,539, filed May 11, 1983, and assigned to the assignee of the present invention. Here a current mirror mirror is employed to drive the quasi-complementary output stage.

From the above, it is clear that NPN output transistors are preferred for use in the output stage of IC devices. However, the use of JFET biasing or quasi-complementary circuits have drawbacks that would be desirable to avoid.

SUMMARY OF THE INVENTION

It is an object of the invention to employ a pair of NPN output transistors wherein the current sourcing transistor includes a reference emitter and the current sink transistor is biased from an op amp that responds to the differential voltage between the reference emitter and the normal current source emitter.

It is a further object of the invention to employ a dual emitter NPN transistor as an output stage current source and an NPN transistor current sink wherein a pair of PNP common base transistors are employed to sense the differential voltage between the dual emitters and to develop a bias voltage for the current sink transistor.

These and other objects are achieved in a circuit configured as follows. A pair of NPN transistors are coupled in series across the power supply with their juncture forming the stage output terminal. The pull-up, or source, transistor is provided with an extra emitter that operates as a reference emitter and is scaled smaller with respect to the regular emitter. The two emitters are coupled to the input of an op amp that requires a pair of current inputs. The reference emitter supplies one input current and the regular emitter provides a similar current to the other input. The op amp output is employed to drive the base of the current sink, or pull-down, transistor. Thus, the op amp in conjunction with the current sink transistor forms a negative feedback loop connected to the regular current source emitter. When the circuit is sourcing current the sink transistor is turned off. However, when the input drive is in the output pull-down direction the sink transistor is turned on, but the source transistor is not completely turned off. Its conduction drops to a level equal to the circuit quiescent current. If desired a conventional PNP sink transistor can be included in the circuit, in which case it serves to conduct the quiescent current which also flows in the source transistor. In this case, the sink transistor is actually biased for class B operation. The PNP transistor acts primarily to reduce crossover distortion.

The base of the source transistor is driven from a high gain input stage which includes a two diode level shifter so that the NPN/PNP combination can be directly driven at the proper levels.

BRIEF DESCRIPTION OF THE DRAWING

FIG. 1A is a simplified schematic-block diagram of the circuit of the invention.

FIG. 1B shows transistor 16 of FIG. 1 as two separate transistors.

FIG. 2 is a complete schematic diagram of the circuit of the invention.

DESCRIPTION OF THE INVENTION

FIG. 1 is a simplified schematic-block diagram of the circuit of the invention. An operating power supply is connected + to $V_{CC}$ terminal 10 and − to $V_{EE}$ terminal 11. The output at terminal 12 is an inverted response to the signal input at terminal 13. The output stage operates in the class AB mode and is intended to provide a substantal output to load 14. Only one PNP transistor 15 is involved and it conducts only a small fraction of the maximum current output. In fact, transistor 15 only conducts the stage quiescent current so the typical instabilities encountered in complementary output stages are avoided. In the situation where the conventional PNP output transistor is a substrate collector vertical device all of the PNP current must flow in the substrate. This can be troublesome in IC structures. In the present circuit the substrate current is limited to the quiescent current.

The heart of the output stage is transistor 16. It is shown in FIG. 1A as a dual emitter transistor, but emitter 17 is made much larger than emitter 18. While transistor 16 is shown in FIG. 1A as a single dual emitter device, it can be composed of two ratioed devices with their bases and collectors connected in common as shown in FIG. 1B.

In one application transistor 16 was fabricated to have ten separate equal-size emitters. Nine were connected in parallel to form emitter 17 and one formed emitter 18 thus giving an area ratio of nine as shown. Emitter 17 is coupled to the output terminal so that transistor 16 is the output current source device. Transistor 19 is a second output device of the same polarity and is coupled to sink current from terminal 12. Since transistor 19 matches transistor 16 the source/sink capability is symmetrical.

Transistor 19 is driven by op amp 20 which responds to the differential $V_{BE}$ of emitters 17 and 18 in transistor 16. When transistor 16 is sourcing current to load 14 the emitter differential will cause op amp 20 to turn transistor 19 off.

Op amp 20 is a transconductance amplifier that draws a small controlled input current as will be shown below. This input current will flow in emitter 18 and nine times this current will flow in emitter 17. Op amp 20 in conjunction with transistor 19 forms a feedback loop, having high gain, around emitter 17 of transistor 16. Emitter 17 forms the load element for transistor 19. In operation this feedback loop will modulate the conduction of transistor 19 so that the differential voltage between emitters 17 and 18 is zero. This means that as long as transistor 19 is turned on, in the current sinking mode, transistor 16 will remain on and will conduct at a level determined by the input current of op amp 20.

In the absence of any input signal (the quiescent state) transistor 15 conducts an idling current. This current also flows in transistor 16 which, as shown above, is never completely turned off.

The base of transistor 16 is driven from a current mirror driver composed of transistors 21-25. Current source 26 forces $I_1$ to flow in transistors 22 and 24. It will be noted that transistor 21 forces transistor 23 to act as a diode and transistor 22 forces transistor 23 to act as a diode. $I_2$ flowing in transistors 21, 23 and 25 mirrors $I_1$. Transistors 24 and 25 act as high gain input inverter devices which, due to their connections to input terminal 13, drive nodes 26 and 27. Node 26 is coupled to drive the base of transistor 16. Node 27 is coupled to drive the base of transistor 15 and is biased two diodes below node 26 by the diode action of transistors 22 and 23. Thus, for quiescent conditions transistors 15 and 16 operate as a conventional complementary pair.

When terminal 13 is driven negative node 26 rises and transistor 16 sources most of current $I_3$ to terminal 12. The maximum output source current is equal to $I_1$ multiplied by the cascaded Betas of transistors 21 and 16. Transistor 15 is turned off due to the rise of node 27.

When terminal 13 is driven positive, nodes 26 and 27 will fall. The sourcing current in transistor 16 will fall to the quiescent value and the feedback loop described above will hold its current at this value. The differential $V_{BE}$ in emitters 17 and 18 will cause the output of op amp 20 to rise thereby turning transistor 19 on so as to sink current from terminal 12.

FIG. 2 is a more detailed schematic diagram of the circuit of the invention. Where the parts if FIG. 1 are present the same numbers are used.

Resistors 33 and 34 form the input of op amp 20. They respectively couple the emitters of transistors 30 and 31 to emitters 18 and 17. Transistors 30 and 31 are each dual transistors that have collectors designated y and 3y. In each case the larger collector is returned to the base and connected to current sink 32. The smaller of the collectors are returned to a current mirror load made up of transistors 35 and 36 to provide a single ended output. It can be seen that op amp 20 will draw an input current that is determined by sink 32. Transistor 36 drives emitter follower transistor 37 which in turn drives output current sink transistor 19. The emitter of transistor 37 is returned to the negative supply rail by resistor 38. Output transistor 19 is shown having a series emitter resistor 40. Diodes 41 and 42 are present to prevent transistor 36 from saturating regardless of how much current is sourced by transistor 16. Capacitor 43 is present to frequency compensate op amp 20. PNP output transistor 15 is shown having resistor 44 in series with its emitter. Resistor 45 is in series with output terminal 12. In a practical circuit resistor 40 is part of an output current sink limiter (not shown) and resistor 45 is part of an output current source limiter (not shown).

The presence of resistor 44 and transistor 15 reduces the circuit cross over distortion to a very low value. Resistors 33 and 34 limit the gain of op amp 20 to achieve stable feedback loop operation. As explained above, diodes 41 and 42 prevent saturation in transistor 36 and thereby aid in reducing cross over distortion at the higher signal frequencies.

EXAMPLE

The circuit of FIG. 2 was constructed using conventional junction isolated monolithic silicon IC elements. The transistors had typical Beta values on the order of 200. In transistor 16 emitter 18 was of standard unit area and emitter 17 was of nine time unit area. Transistors 22 and 23 were each of three times unit emitter area. Transistor 19 had a matching nine times unit area. The following component values were employed.

| Component | Value | Units |
|---|---|---|
| current source 26 | 200 | microamperes |
| current sink 32 | 60 | microamperes |
| resistors 33, 34 | 1.2K | ohms |
| resistor 38 | 7.5K | ohms |
| resistor 40 | 50 | ohms |
| capacitor 43 | 2 | picofarads |
| resistor 44 | 30 | ohms |
| resistor 45 | 15 | ohms |

The quiescent transistor output current was about 720 microamperes.

Using a ±22 volt (44 volts overall) power supply and a 500 ohm load the circuit could source and sink over 40 milliamperes. The gain bandwidth product was about 20 MHz at 100 KHz. The total harmonic distortion was less than 0.002%. The slew rate was about 10 volts per microsecond.

The invention has been described and a working example detailed. When a person skilled in the art reads the foregoing description, alternatives and equivalents, within the spirit and intent of the invention, will be apparent. Accordingly, it is intended that the scope of the invention be limited only by the following claims.

I claim:

1. An integrated output stage circuit having an input and output terminals and first and second power supply terminals connectable to a source of operating power, said circuit comprising:
- a source NPN transistor having its emitter coupled to said output terminal, its collector coupled to said first power supply termial and a base;
- a source reference NPN transistor having its collector and base terminals coupled to like elements in said source NPN transistor and an emitter;
- a sink NPN transistor having its collector coupled to said output terminal, its emitter coupled to said second power supply terminal, and a base;
- an operational amplifier having its non-inverting input coupled to said emitter of said source NPN transistor, its inverting input coupled to said emitter of said source reference transistor and its output coupled to said base of said sink NPN transistor; and
- signal drive means coupled to said base of said source NPN transistor.

2. An integrated output stage circuit having an input and output terminals and first and second power supply terminals connectable to a source of operating power, said circuit comprising:
- a dual emitter NPN transistor having its collector coupled to said first power supply terminal, a base, a source emitter coupled to said output terminal and a reference emitter;
- a sink NPN transistor having its collector coupled to said output terminal, its emitter coupled to said second power supply terminal, and a base;
- an operational amplifier having its non-inverting input coupled to said source emitter, its inverting input coupled to said reference emitter and its output coupled to said base of said sink NPN transistor; and
- signal drive means coupled to said base of said dual emitter NPN transistor.

3. The circuit of claim 2 wherein said dual emitter NPN transistor involves ratioed emitters and said reference emitter is the smaller of the two emitters.

4. The circuit of claim 1 wherein said operational amplifier includes inputs that require an operating current that can be controlled to establish the quiescent current of said circuit.

5. The circuit of claims 1 or 2 further comprising a PNP sink transistor having an emitter coupled to said output terminal, a collector coupled to said second power supply terminal and a base coupled to said signal drive means.

6. The circuit of claim 5 wherein said signal drive means contains level shifting means whereby said PNP sink transistor is driven at a level that is two junction diode voltages below said base of said source NPN transistor.

7. The circuit of claims 1 or 2 wherein said operational amplifier includes an input stage in which a pair of PNP transistors are operated as common base connected devices whereby the input signal must include a direct current biasing component.

8. The circuit of claim 7 wherein said input stage PNP transistors are plural collector devices and one collector in each transistor is returned to its base and to a constant current sink which determines said direct current biasing component.

9. The circuit of claim 8 wherein resistors are coupled in series with the emitters of said pair of PNP transistors.

* * * * *